(12) United States Patent
Ishii et al.

(10) Patent No.: US 6,967,622 B2
(45) Date of Patent: Nov. 22, 2005

(54) PLASMA DEVICE AND PLASMA GENERATING METHOD

(75) Inventors: Nobuo Ishii, Amagasaki (JP); Makoto Ando, 1-1-I-312, Ogura, Saiwai-ku, Kawasaki-shi, Kanagawa (JP)

(73) Assignees: Tokyo Electron Limited, Tokyo (JP); Makoto Ando, Kawasaki (JP)

( * ) Notice: Subject to any disclaimer, the term of this patent is extended or adjusted under 35 U.S.C. 154(b) by 0 days.

(21) Appl. No.: 10/466,281

(22) PCT Filed: Jan. 17, 2002

(86) PCT No.: PCT/JP02/00294

§ 371 (c)(1),
(2), (4) Date: Jul. 15, 2003

(87) PCT Pub. No.: WO02/058123

PCT Pub. Date: Jul. 25, 2002

(65) Prior Publication Data

US 2004/0051464 A1 Mar. 18, 2004

(30) Foreign Application Priority Data

Jan. 18, 2001 (JP) .............................. 2001-10107

(51) Int. Cl.[7] .............................................. H01Q 1/26
(52) U.S. Cl. ...................................... 343/701; 343/770
(58) Field of Search ................................ 343/701, 746, 343/767, 768, 769, 770

(56) References Cited

U.S. PATENT DOCUMENTS

| | | | |
|---|---|---|---|
| 6,158,383 A * | 12/2000 | Watanabe et al. | 118/723 AN |
| 6,346,915 B1 * | 2/2002 | Okumura et al. | 343/701 |
| 6,492,951 B1 * | 12/2002 | Harris et al. | 343/701 |
| 6,512,483 B1 * | 1/2003 | Holden et al. | 343/701 |
| 6,607,633 B2 * | 8/2003 | Noguchi | 156/345.41 |
| 2002/0094584 A1 * | 7/2002 | Shieh et al. | 436/514 |
| 2004/0027293 A1 * | 2/2004 | Miyake et al. | 343/701 |

FOREIGN PATENT DOCUMENTS

| | | |
|---|---|---|
| JP | 9-181052 | 7/1997 |
| JP | 2000-77335 | 8/2000 |
| JP | 2000-260747 | 9/2000 |

* cited by examiner

*Primary Examiner*—Don Wong
*Assistant Examiner*—Huedung X. Cao
(74) *Attorney, Agent, or Firm*—Crowell & Moring LLP

(57) ABSTRACT

A plasma apparatus includes a slot antenna (30) supplying an electromagnetic field to a container in which plasma is generated. Slot antenna (30) has a slot (36) so formed that a radiation plane (31) at a periphery B thereof allows the electromagnetic field to provide radiation smaller per unit area in amount than at an intermediate region C thereof located between a center A and periphery B thereof.

9 Claims, 8 Drawing Sheets

⟨1⟩ L = 2.32 → 2.98
⟨2⟩ L = 2.32 → 2.98 → 2.32
⟨3⟩ L = 2.32
⟨4⟩ L = 2.32 → 1.66

UNIT : cm

PLASMA DEVICE AND PLASMA GENERATING METHOD

TECHNICAL FIELD

The present invention relates to plasma apparatuses and generation methods using a slot antenna to supply a container with an electromagnetic field to generate plasma.

BACKGROUND ART

Semiconductor devices, flat panel displays and the like are produced using a variety of plasma apparatuses for example to form oxide film, provide crystal growth for semiconductor layers, and effect etching, ashing and other processes. One such plasma apparatus is a high frequency plasma apparatus using a slot antenna to supply a processing container with a high frequency electromagnetic field which is used to generate a high density plasma. This high frequency plasma apparatus can constantly generate plasma if a plasma gas provides a relatively low pressure. As such it is susceptible to a variety of applications.

FIG. 7 shows one exemplary configuration of a conventional high frequency plasma apparatus. This figure shows a portion of the configuration, as seen in a longitudinal cross section.

This plasma apparatus includes a cylindrical processing container 111 having an opened top and a bottom. At the bottom of processing container 111 is fixed a substrate platform 122 having a surface on which an object to be processed, i.e., a substrate 121 is placed. Processing container 111 has a sidewall provided with a nozzle 117 for supplying a plasma gas and a bottom provided with an exhaust port 116 for evacuation. The processing container 111 opened top is sealed with a dielectric plate 113 to prevent plasma from externally leaking therefrom.

Above dielectric plate 113 a radial antenna 130 corresponding to a type of slot antenna is arranged. Radial antenna 130 is formed of two parallel round conductor plates 131, 132 together forming a radial waveguide 133, and a conductor ring 134 connecting conductor plates 131, 132 at their respective outer peripheral portions. Radial waveguide 133 has an upper surface, or conductor plate 132, having a center provided with an inlet 135 introducing into radial waveguide 133 an electromagnetic field F supplied from a high frequency generator 144 via a circular polarization converter 142. Furthermore, radial waveguide 133 has a lower surface, or conductor plate 131, provided with a plurality of slots 136 concentrically, as shown in FIG. 8A, to allow electromagnetic field F propagating in radial waveguide 133 to be supplied to processing container 111 through dielectric plate 113. Conductor plate 131 acts as a radiation plane of radial antenna 130. Furthermore, radial antenna 130 and dielectric plate 113 have an outer periphery covered with an annular shielding member 112 to prevent electromagnetic field F from leaking externally.

Electromagnetic field F introduced from high frequency generator 144 into radial antenna 130 propagates from the center toward the periphery of radial waveguide 133 radially and is thus radiated through the plurality of slots 136 little by little. Accordingly, radial waveguide 133 has an internal power density high at the center and decreasing gradually as it approaches the periphery. On the other hand, slot 136 provides a coefficient of radiation gradually increasing for a length of L2 of slot 136 increasing from 0, and it is maximized for L2 having a length of one half of a wavelength λg of electromagnetic field F in radial waveguide 133. Accordingly, for slot 136 having length L2 with an upper limit of λg/2, length 2 is conventionally, gradually increased, as seen from the radiation plane's center O toward the periphery, as shown in FIG. 8B, to allow the radial antenna 130 radiation to be uniform across the radiation plane.

If radial antenna 130 having slot 136 with length L2 thus designed is used to generate plasma, however, the plasma is not distributed uniformly, as shown in FIG. 9, as seen in a plane parallel to the substrate bearing surface of substrate platform 122, and would have a high density in a vicinity of the periphery. If substrate 121 is processed in such uneven plasma, the substrate is more rapidly processed at a region underlying the plasma having a high density, resulting in a variation in the processing of the substrate.

DISCLOSURE OF THE INVENTION

The present invention has been made to overcome such a disadvantage as described above and it contemplates more uniform plasma distribution as seen in a plane.

To achieve such an object, the present invention provides a plasma apparatus wherein a slot antenna supplying an electromagnetic field to a container to generate plasma therein is provided with a slot so formed that at a periphery of a radiation plane the electromagnetic field provides radiation smaller per unit area in amount than at an intermediate region of the radiation plane located between a center of the radiation plane and the periphery of the radiation plane to reduce plasma that is generated in the container in a vicinity of the periphery.

The slot may be so formed that the electromagnetic field's radiation per unit area monotonically decreases in amount, as seen from the intermediate region toward the periphery of the radiation plane.

More specifically each slot may be monotonically increased in length, as seen from the center toward the intermediate region of the radiation plane, and monotonically decreased in length, as seen from the intermediate region toward the periphery of the radiation plane.

Furthermore the radiation plane per unit area may have slots monotonically increasing in number, as seen from the center toward the intermediate region of the radiation plane, and monotonically decreasing in number, as seen from the intermediate region toward the periphery of the radiation plane.

Furthermore the present invention provides a method using a slot antenna to supply a container with an electromagnetic field to generate plasma, allowing the electromagnetic field's radiation per unit area to be smaller in amount at a periphery of a radiation plane of the slot antenna than at an intermediate region of the radiation plane located between a center of the radiation plane and the periphery of the radiation plane to reduce plasma that is generated in the container in a vicinity of the periphery.

The electromagnetic field's radiation per unit area may monotonically be reduced in amount, as seen from the intermediate region toward the periphery of the radiation plane of the slot antenna.

More specifically the slot antenna may be provided with slots each monotonically increased in length, as seen from the center toward the intermediate region of the radiation plane, and monotonically decreased in length, as seen from the intermediate region toward the periphery of the radiation plane, to achieve the radiation profile as described above.

Furthermore each slot may be formed so that the slot antenna's radiation plane per unit area has slots monotonically increasing in number, as seen from the center toward the intermediate region of the radiation plane, and monotonically decreasing in number, as seen from the intermediate region toward the periphery of the radiation plane, to achieve the radiation profile as described above.

BEST MODE FOR CARRYING OUT THE INVENTION

Hereinafter with reference to the drawings the present invention in embodiments will more specifically be described.

First Embodiment

Figure 1:
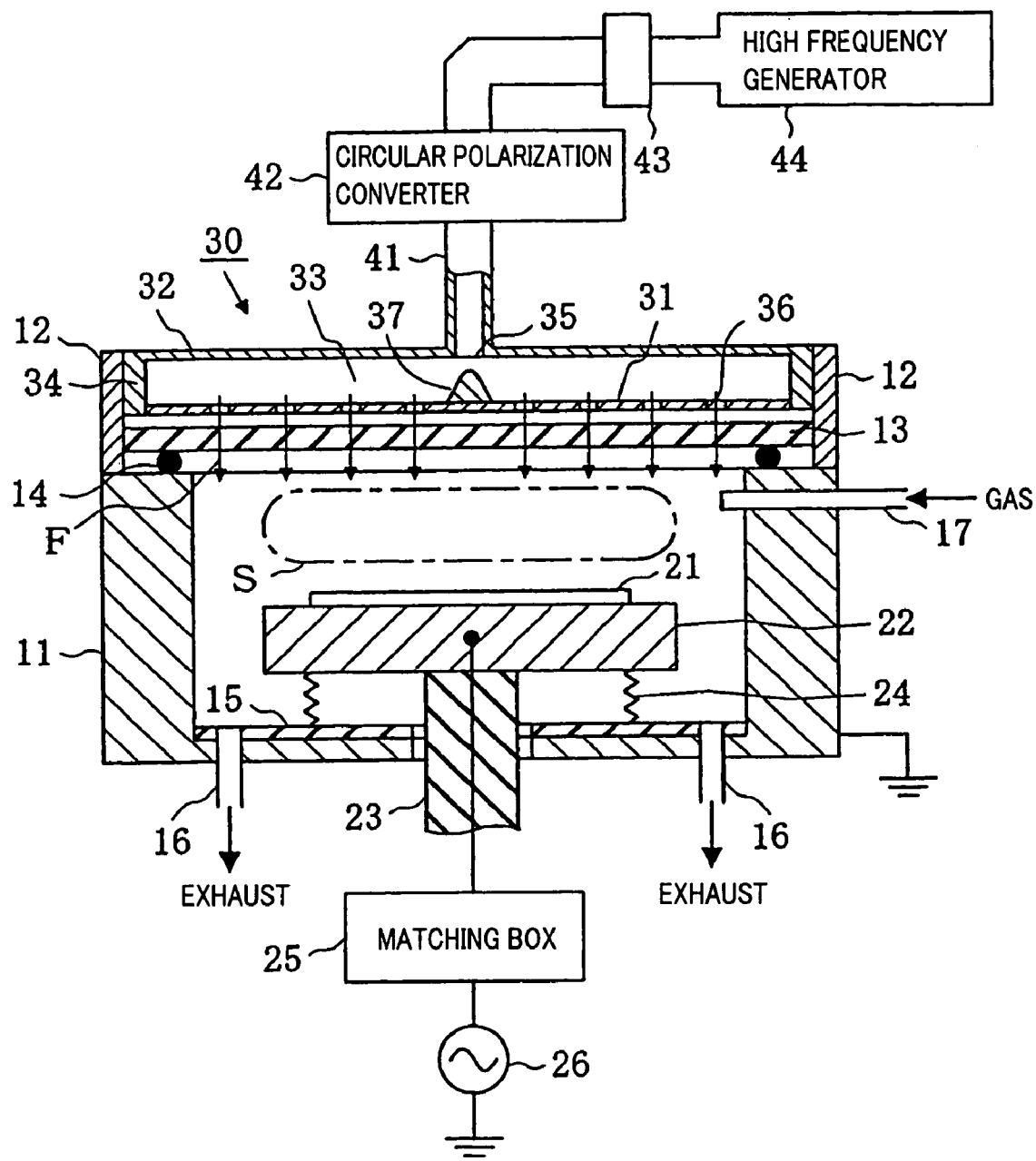
FIG. 1 shows a configuration of the present plasma apparatus in a first embodiment.

FIG. 1 shows a configuration of the present plasma apparatus in a first embodiment. The figure shows a portion of the configuration, as seen in a longitudinal cross section.

The present plasma apparatus includes a cylindrical processing container 11 having an opened top and a bottom. Processing container 11 is formed of conductor such as aluminum. At the opened top of processing container 11 is arranged a dielectric plate 13 formed of approximately 20 to 30 mm thick quartz glass or ceramic ($Al_2O_3$, AlN or the like). Processing container 11 and dielectric plate 13 are joined at a portion, which is provided with an O ring or a similar sealing member 14 to ensure hermeticity in processing container 11.

Processing container 11 has a bottom provided with an insulator plate 15 formed for example of ceramic. Furthermore, insulator plate 15 and the processing container 11 bottom are penetrated by an exhaust port 16 communicating with a vacuum pump (not shown) allowing processing container 11 to have a desired degree of internal vacuum. Furthermore, processing container 11 has a sidewall provided with a nozzle 17 supplying processing container 11 with Ar or a similar plasma gas, $CF_4$ or a similar processing gas, and the like. Nozzle 17 is for example a pipe formed of quarts.

Processing container 11 houses a columnar substrate platform 22 having a surface for bearing an object to be processed, i.e., a substrate 21 thereon. Substrate platform 22 is supported by an elevator shaft 23 penetrating a bottom of processing container 11 so that it moves vertically as desired. Furthermore, substrate platform 22 is connected to a biasing high frequency power supply 26 via a matching box 25. High frequency power supply 26 outputs a frequency in a range from several hundreds kHz to several tens MHz, as predetermined, for the sake of illustration. Note that to ensure hermeticity in processing container 11 a bellows 24 is provided between substrate platform 22 and insulator plate 15 to surround elevator shaft 23.

Furthermore on dielectric plate 13 a radial antenna 30 corresponding to a type of slot antenna is arranged. Radial antenna 30 is isolated by dielectric plate 13 from processing container 11 so that it is protected from plasma generated in processing container 11. Radial antenna 30 and dielectric plate 13 have an outer periphery covered with a shielding member 12 arranged on a sidewall of processing container 11 annually to prevent external leakage of electromagnetic field F.

Radial antenna 30 has a center connected by a cylindrical waveguide 41 to high frequency generator 44 generating a high frequency electromagnetic field F of a predetermined frequency falling within a range of 1 GHz to several tens GHz. In cylindrical waveguide 41 there are provided a matching circuit 43 contemplating impedance-matching, and a circular polarization converter 42 rotating about an axis of the waveguide 41 a main direction of an electric field propagating through the waveguide.

Radial antenna 30 is configured, as will further be described hereinafter.

Radial antenna 30 is formed of two round conductor plates 31, 32 arranged in parallel and forming radial waveguide 33, and a conductor ring 34 connecting conductor plates 31, 32 at their respective outer peripheral portions for shielding. Conductor plates 31, 32 and conductor ring 34 are formed of conductor such as copper or aluminum.

Radial waveguide 33 has an upper surface, or conductor plate 32, having a center provided with an inlet 35 introducing electromagnetic field F into radial waveguide 33, and to inlet 35 cylindrical waveguide 41 is connected.

Internal to radial waveguide 33 conductor plate 31 has a center provided with a conical member 37 protruding toward inlet 35. Conical member 37 is also formed of the same conductor as conductor plates 31, 32 and the like. Conical member 37 allows electromagnetic field F propagating through cylindrical waveguide 41 to be guided into radial waveguide 33 satisfactorily.

Radial waveguide 33 has a lower surface, or conductor plate 31, provided with a plurality of slots 36 supplying processing container 11 with electromagnetic field F propagating through radial waveguide 33. Conductor plate 31 configures a radiation plane of radial antenna 30.

Figure 2A:
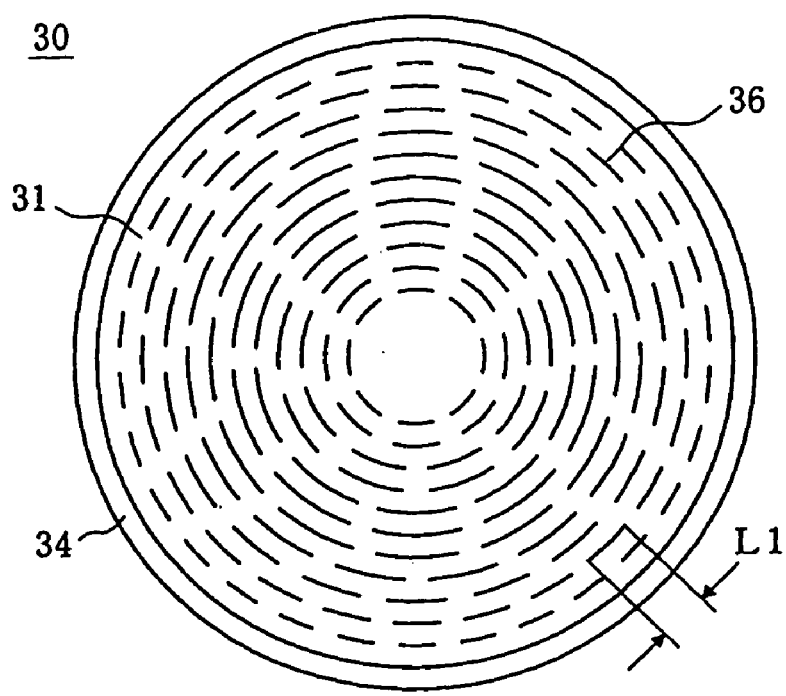
FIG. 2A is a plan view of one example of a radiation plane of a radial antenna of the FIG. 1 plasma apparatus.
Figure 2B:
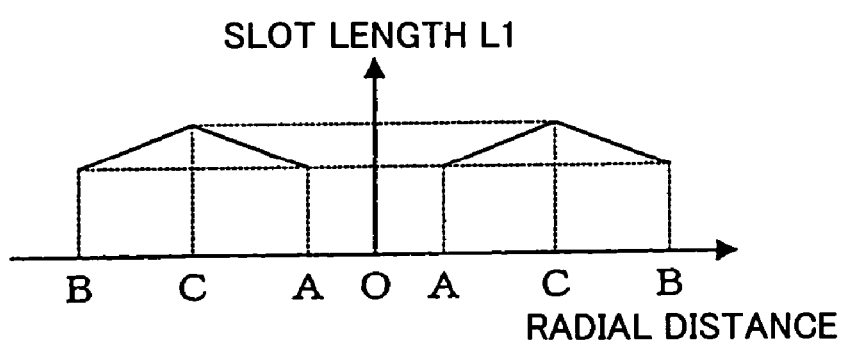
FIG. 2B is a graph representing a distribution of a length of a slot of the radiation plane shown in FIG. 2A.
Figure 2C:
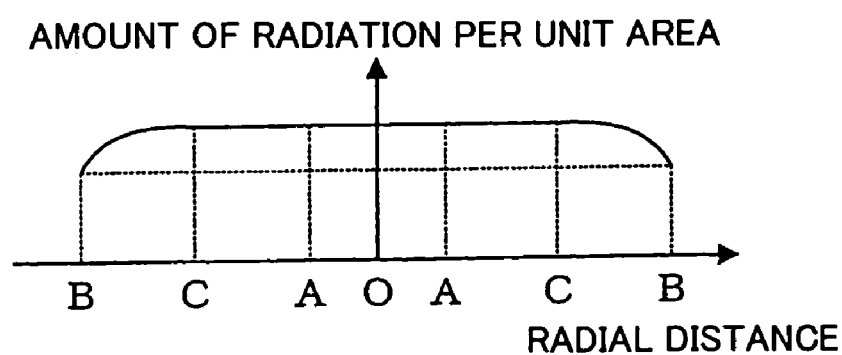
FIG. 2C is a graph representing a distribution in amount of radiation of electromagnetic field F of the radiation plane shown in FIG. 2A.

FIGS. 2A–2C are diagrams for illustrating radial antenna 30. FIG. 2A is a plan view showing an exemplary configuration of the radiation plane. FIG. 2B represents a distribution of a length of slot 36. FIG. 2C represents a distribution in amount of radiation of electromagnetic field F. Note that in FIG. 2B, the horizontal axis represents a radial distance from a center O of conductor plate 31 forming the radiation plane and the vertical axis represents a length L1 of slot 36.

Furthermore in FIG. 2C the horizontal axis also represents a radial distance from center O of conductor plate 31 and the vertical axis represents radiation of electromagnetic field F in amount at the radiation plane per unit area. Furthermore FIGS. 3A–3D show exemplary forms of slot 36.

Slot 36, for example as shown in FIG. 2A, is formed concentrically. Alternatively, it may be formed helically from the center toward the periphery or it may be formed radially.

Figure 3A:
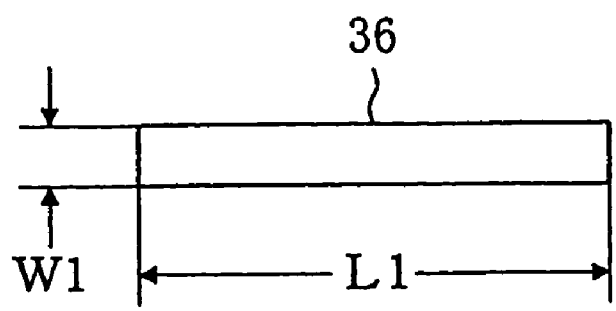
FIGS. 3A–3D show exemplary forms of the slot.
Figure 3B:
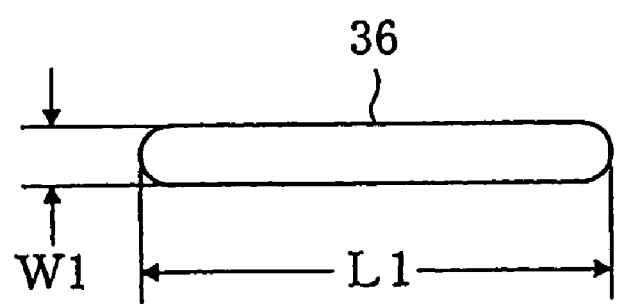
Figure 3C:
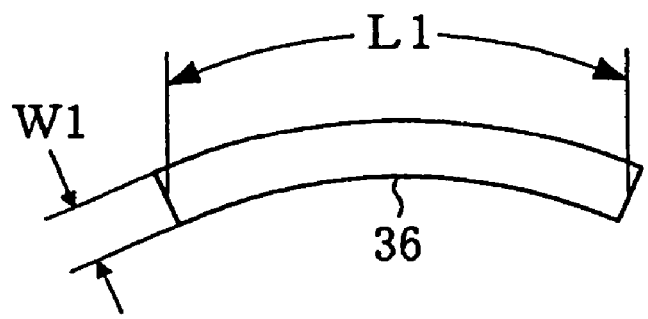
Figure 3D:
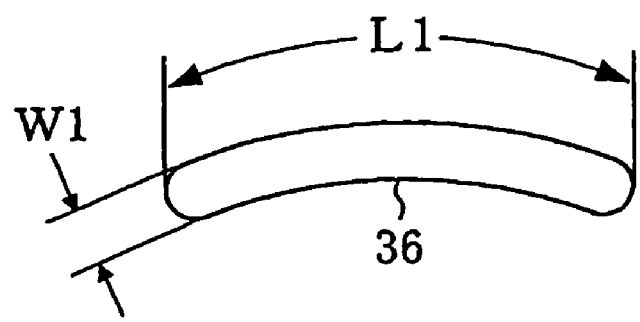

Slot 36 may be formed in a rectangle, as shown in FIG. 3A, or an arc, as shown in FIG. 3C. Furthermore, slot 36 shown in FIGS. 3A, 3C may have its four corners rounded as shown in FIGS. 3B, 3D.

Slot 36 may have a width W1 of approximately 2 mm as consideration is given for example to an effect on electromagnetic field F in radial waveguide 33.

Slot 36 is designed to have a length L1 to allow radiation of electromagnetic field F at the radiation plane per unit area (hereinafter also simply referred to as "radiation") to have a distribution as shown in FIG. 2C. More specifically, if conductor plate 31 has a center A, a periphery B and a particular region C intermediate therebetween (hereinafter referred to as "intermediate region C"), slot 36 is designed to have length L1 to provide a substantially uniform radiation in a region extending from center A to intermediate region C and a monotonically reducing radiation in a region extending from intermediate region C toward periphery B. The radiation varies at intermediate region C, the position of which is determined, as appropriate, from processing conditions and the like.

Slot 36 allows an amount of radiation determined by a product of a power density in radial waveguide 33 overlying slot 36 and a coefficient of radiation of slot 36. Radial waveguide 33 has an internal power density high at the center and gradually decreasing as it approaches to the periphery. Furthermore, slot 36 provides a coefficient of radiation gradually increasing as the slot 36 length L1 increases from 0 (zero), and maximized for L1 having a length of one half of wavelength λg of electromagnetic field F in radial waveguide 33. As such, if L1 has an upper limit of λg/2, then, as shown in FIG. 2B, providing slot 36 with length L1 monotonically increasing, as seen from center A toward intermediate region C of waveguide 31, and monotonically decreasing, as seen from internal region C toward periphery B, can provide a distribution of radiation as seen in a plane, as shown in FIG. 2C.

Note that if slot 36 has length L1 falling within a range of λg/2☐L1☐¾×λg, providing slot 36 with length L1 monotonically decreasing, as seen from center A toward intermediate region C of conductor plate 31, and monotonically increasing, as seen from intermediate region C toward periphery B, can provide a distribution of radiation as seen in a plane, as shown in FIG. 2C.

With adjacent slots 36 spaced by approximately λg widthwise, radial antenna 30 may be formed to be an antenna of radiation type. Alternatively, with adjacent slots spaced by λg/20 to λg/30 widthwise, it may be formed to be an antenna of leakage type.

The FIG. 1 plasma apparatus operates, as will be described hereinafter.

Substrate 21 is placed on the substrate bearing surface of substrate platform 22 and processing container 11 is vacuumed to have a degree of vacuum for example of approximately 0.01 to 10 Pa. This degree of vacuum is maintained, while for example through nozzle 17 a plasma gas of Ar and a processing gas of $CF_4$ are supplied. In this condition, electromagnetic field F from high frequency generator 44 is circularly polarized by circular polarization converter 42 and supplied to radial antenna 30.

Electromagnetic field F introduced into radial antenna 30 propagates from a center of radial waveguide 33 toward a periphery of the waveguide radially, while it is radiated through the plurality of slots 36 little by little. Electromagnetic field F that is not radiated through slot 36 and reaches conductor ring 34 will be reflected thereby and again directed toward the center. Thereafter, electromagnetic field F propagates through radial waveguide 33 back and forth and is thus gradually radiated through the plurality of slot 36. It should be noted, however, that the radiation plane in the vicinity of the periphery provides radiation relatively smaller in amount than in the other regions.

Electromagnetic field F radiated from radial antenna 30 is transmitted through dielectric plate 13 and introduced into processing container 11. Electromagnetic filed F acts to ionize Ar present in processing container 11 to generate plasma and also dissociate $CF_4$ to generate radicals in a space S over substrate 21. This plasma is controlled in energy, anisotropy and the like by a bias voltage applied to substrate platform 22 and used for a plasma process together with radical $CF_x$ adhering to substrate 21, wherein x=1, 2, 3.

Hereinafter is shown a result of an experiment using the FIG. 1 plasma apparatus. In the experiment, four types of radial antennas <1> to <4> having different slot patterns were used to generate plasma and their respective ion saturation current $I_{io}$ distributions were measured. Ion saturation current $I_{io}$ is proportional to a plasma density $N_i$, as represented by the following expression:

$$I_{io}=0.6 \cdot N_i \cdot \exp[(KT_e/m_i)^{1/2}] \cdot S,$$

wherein $T_e$: temperature of electron
$m_i$: mass of ion
S: surface area of probe.

As such, examining how ion saturation current $I_{io}$ is distributed can reveal how a plasma is distributed.

Figure 4:
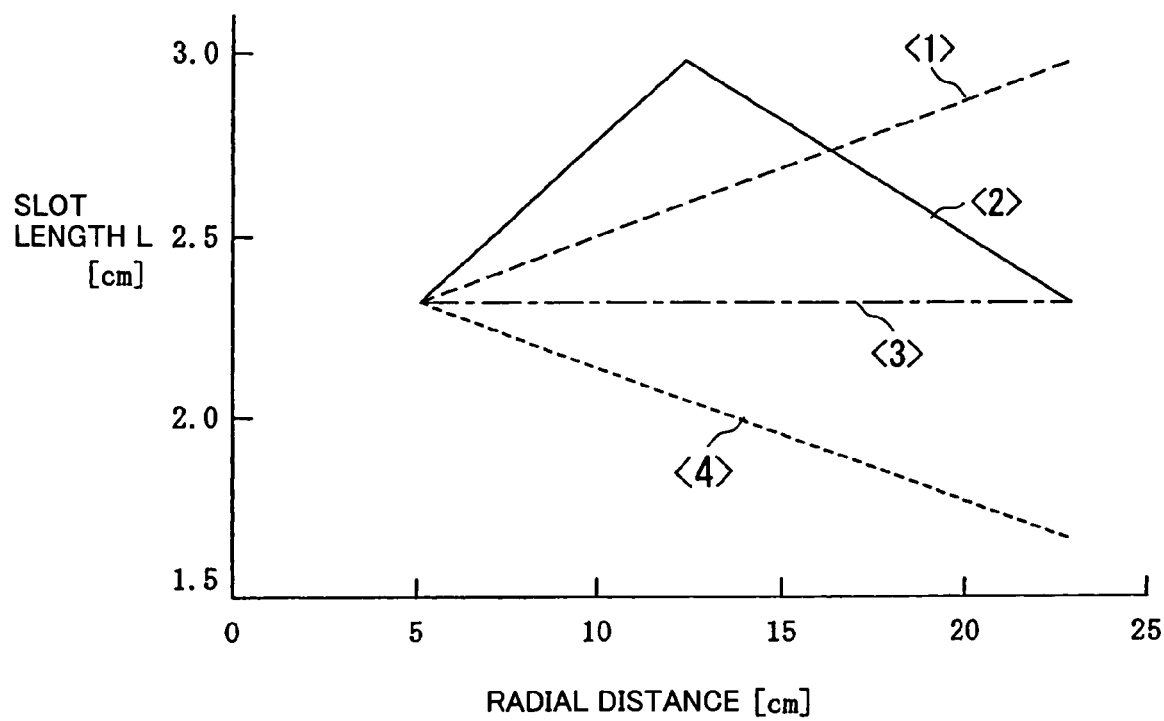
FIG. 4 represents a distribution of a length of a slot of a radial antenna used in an experiment.
Figure 5:
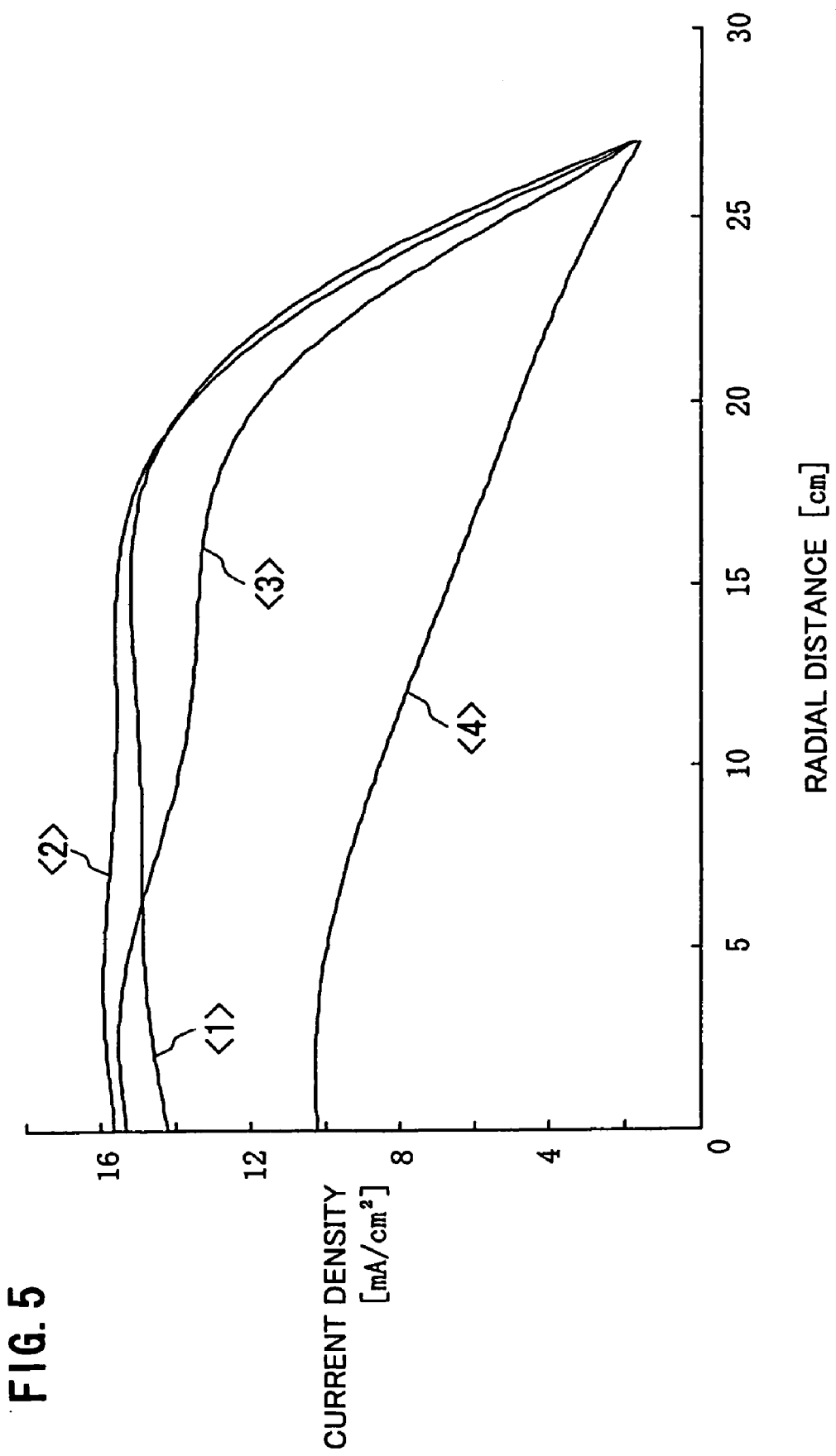
FIG. 5 shows a result of the experiment.

FIG. 4 represents a distribution of slot length L of radial antenna <1> to <4> used in the experiment. The horizontal axis represents a radial distance in centimeters from a center of the radiation plane and the vertical axis represents the slot's length L in centimeters. Note that radial antennas <1> to <4> have their radiation planes with a radius of 24 cm. FIG. 5 shows a result of the experiment. The horizontal axis represents a radial distance in centimeters in the processing container from a center of a plane parallel to the substrate bearing surface of the substrate platform and the vertical axis represents a current density in mA/cm² of ion saturation current $I_{io}$.

Figure 8A:
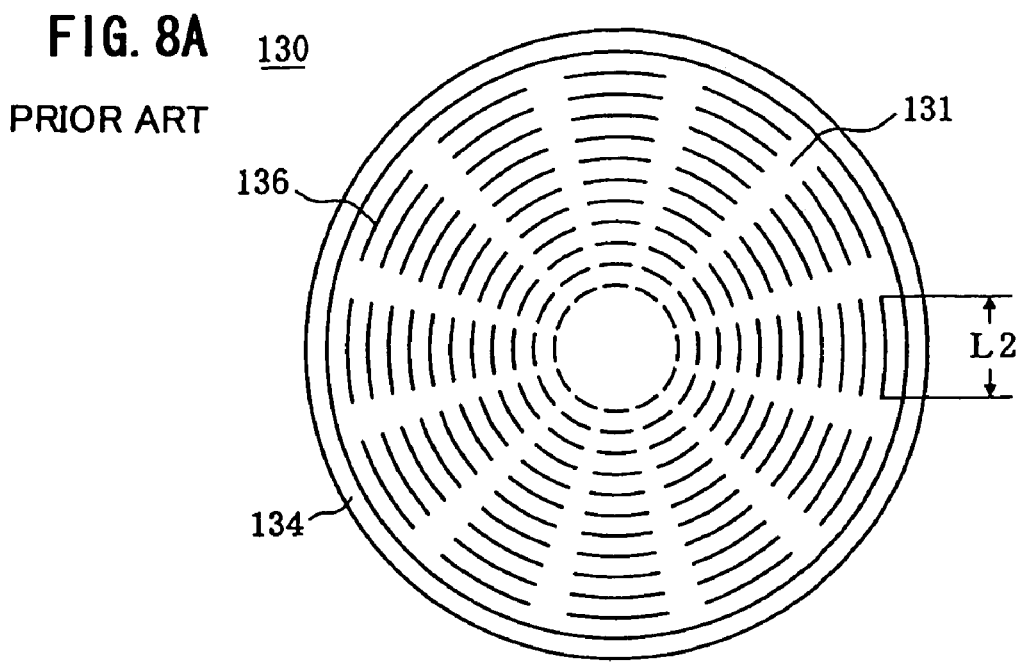
FIG. 8A is a plan view of a radiation plane of a radial antenna used in a conventional plasma apparatus.
Figure 8B:
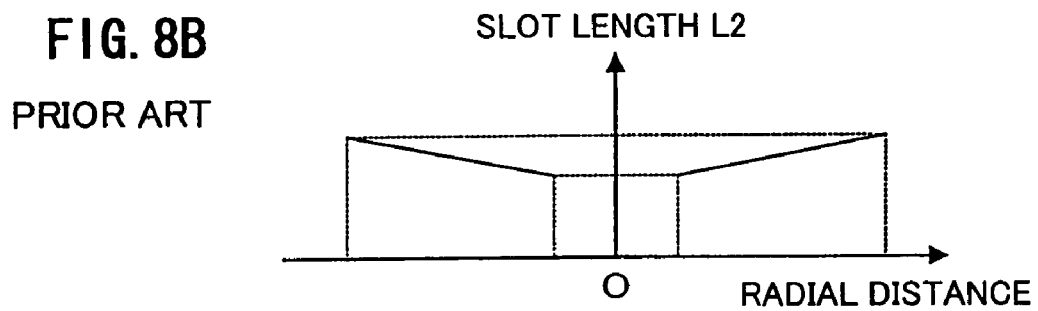
FIG. 8B is a graph representing a distribution of a length of a slot of the radiation plane shown in FIG. 8A.
Figure 9:
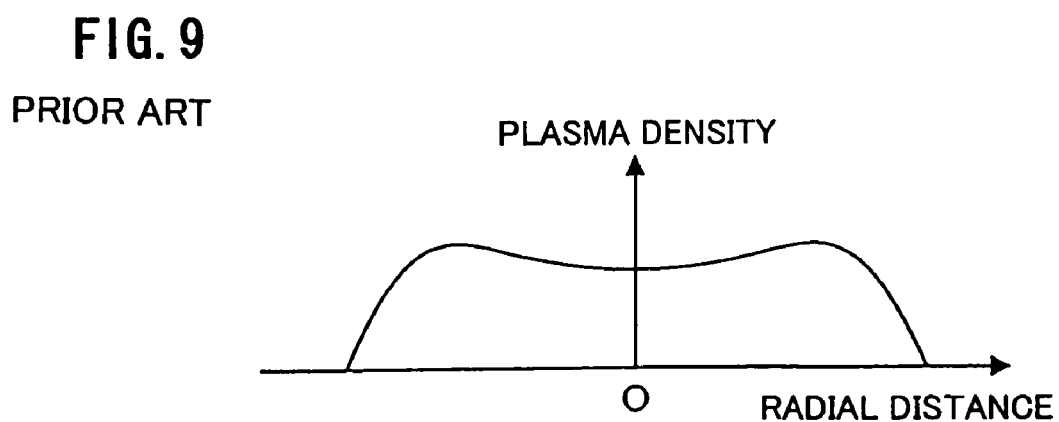
FIG. 9 represents a concept of a distribution of a plasma generated by the conventional plasma apparatus shown in FIG. 7.

Initially, the experiment was conducted with radial antenna <1> having slot length L gradually increasing as seen from the radiation plane's center toward the radiation plane's periphery. Radial antenna <1> corresponds to conventional radial antenna 130 shown in FIG. 8A. While the processing container had an internal pressure set to be 4 Pa, radial antenna <1> was used to supply the container with an electromagnetic field of 2.45 GHz, 2 kW to generate plasma to measure ion saturation current $I_{io}$. A distribution was obtained as indicated in FIG. 5 by <1>. This reveals that a plasma of a high density is generated in a vicinity of a periphery of a plane parallel to the substrate bearing surface of the substrate platform.

The experiment was then conducted with radial antenna <2> having slot length L first increasing and then decreasing as seen from the radiation plane's center toward the radiation plane's periphery. Radial antenna <2> corresponds to radial antenna 30 shown in FIG. 2A. A similar measurement was conducted and, as indicated in FIG. 5 by <2>, a distribution more uniform than indicated by <1> was obtained. This is probably because radial antenna <2> with its radiation plane having an intermediate region (located at 12.5 cm from the center) to a periphery provided with slots having length L gradually decreased allowed less power to be supplied to the region in which a plasma of a high density was generated when radial antenna <1> was used, which contributed to reduced plasma generation in that region and hence a uniform plasma distribution.

A similar experiment was also conducted with radial antenna <3> having a uniform slot length L and radial antenna <4> having slot length L gradually decreasing as seen from the radiation plane's center toward the radiation plane's periphery. The results were as indicated in FIG. 5 by <3> and <4>, failing to provide a uniform distribution as the plasma density decreases as it approaches the periphery.

The above experiment results reveal that using radial antenna 30 having the lot pattern shown in FIG. 2A to generate plasma allows the plasma to have a more uniform distribution as seen in a plane. Using such a plasma can in turn provide a more uniform plasma process than conventional across a surface of substrate 21.

Second Embodiment

Figure 6A:
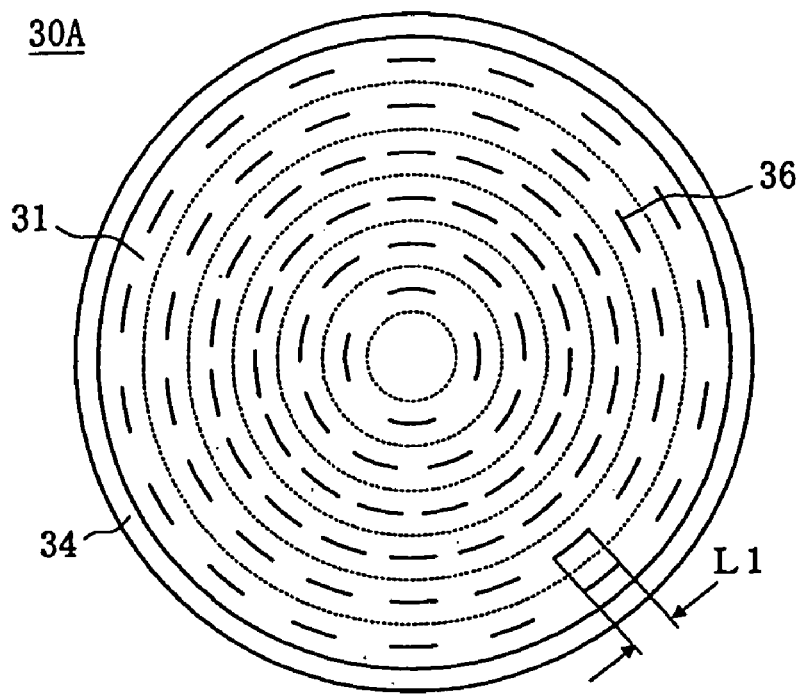
FIG. 6A is a plan view of one example of a radiation plane of a radial antenna of the present plasma apparatus used in a second embodiment.
Figure 6B:
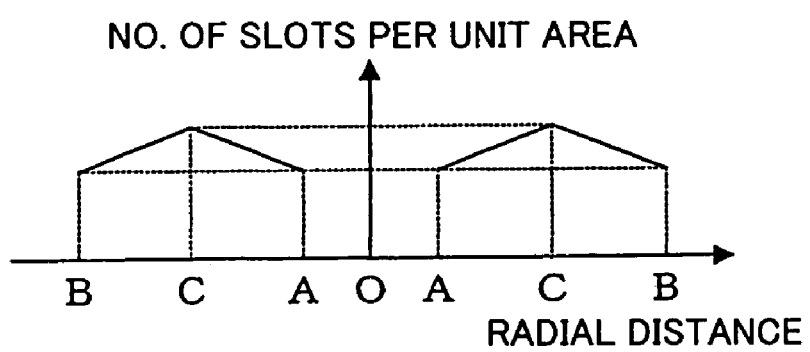
FIG. 6B is a graph representing a distribution in number of slots of the radiation plane shown in FIG. 6A.
Figure 6C:
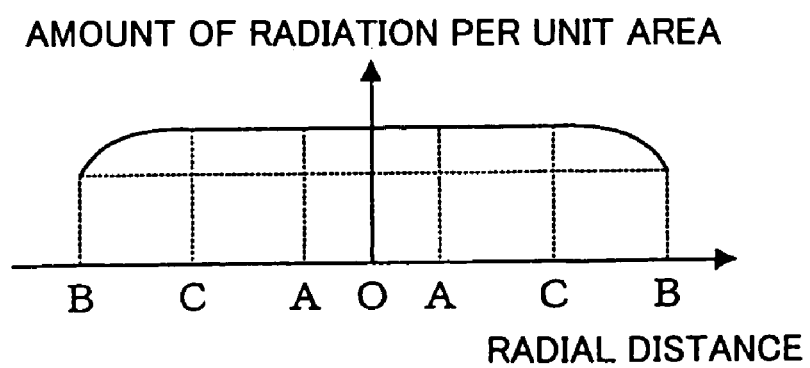
FIG. 6C is a graph representing a distribution in amount of radiation of electromagnetic field F of the radiation plane shown in FIG. 6A.
Figure 7:
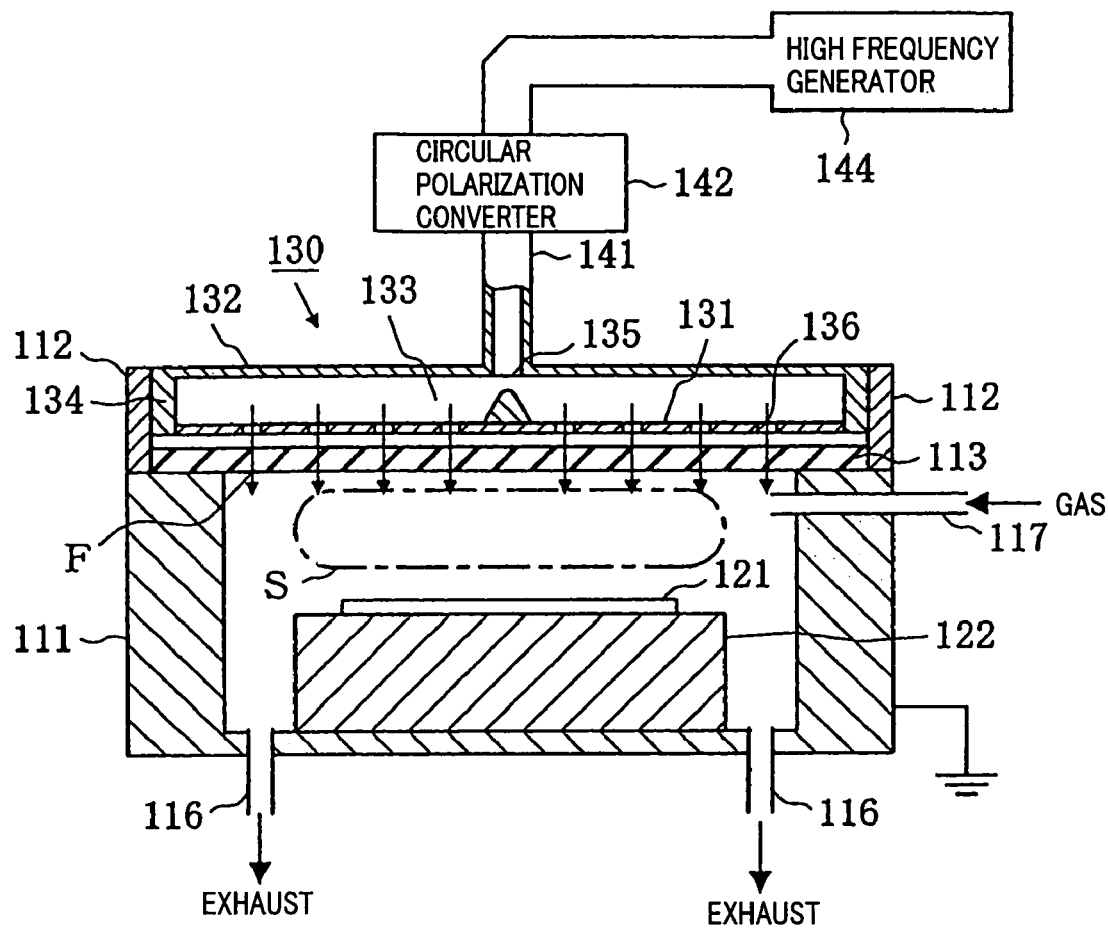
FIG. 7 shows one exemplary configuration of a conventional plasma apparatus.

FIGS. 6A and 6B are diagrams for illustrating a radial antenna used in a second embodiment of the present plasma apparatus. FIG. 6A is a plan view of one exemplary configuration of the antenna's radiation plane. FIG. 6B represents a distribution in number of slot 36. FIG. 6C represents a distribution of radiation of electromagnetic field F in amount. In FIG. 6B, the horizontal axis represents a radial distance from center O of conductor plate 31 forming the radiation plane and the vertical axis represents the number of slots 36 in the radiation plane per unit area. In FIG. 6C, the horizontal axis represents a radial distance from center O of conductor plate 31 and the vertical axis represents radiation of electromagnetic field F in amount at the radiation plane per unit area.

FIG. 6A shows a radial antenna 30A designed to have a number of slots 36 in the radiation plane per unit area so that at the radiation plane per unit area the electromagnetic field F radiation has a distribution in amount, as shown in FIG. 6C. For example if slots 36 are equal in length L, then, as shown in FIG. 6B, providing concentrically arranged slots 36 monotonically increasing in number, as seen from center A toward intermediate region C of conductor plate 31, and monotonically decreasing in number, as seen from intermediate region C toward periphery B of the conductor plate, can provide a radiation distribution, as shown in FIG. 6C, as seen in plane. The radiation varies at a location corresponding to intermediate region C, the position of which is determined from processing conditions and the like, as has been described with reference to FIGS. 2A–2C for radial antenna 30.

Thus varying a distribution in number of slot 36 to adjust radiation, as well as depending on length L of slot 36 to do so, can also provide a more uniform plasma distribution as seen in a plane.

While in the above description the slot antenna has been described as a radial antenna by way of example, it is not limited thereto and a different type of slot antenna, such as a cavity antenna, can also be used to provide a similar effect. A cavity antenna is an antenna which has a cavity resonator resonating in a predetermined mode an electromagnetic field supplied from a high frequency generator, the cavity resonator having a lower surface provided with a plurality of slots for radiating an electromagnetic field. Note that a cavity antenna does not require a cavity resonator having an upper center provided with an inlet for introducing an electromagnetic field.

The present plasma apparatus can also be applied to an electron cyclotron resonance (ECR) plasma apparatus. Furthermore, the present plasma apparatus can be used for etching apparatuses, plasma CVD apparatuses and the like.

Thus in the present invention an electromagnetic field's radiation at a periphery of a radiation plane of a slot antenna per unit area can be smaller than that at an intermediate region of the radiation plane of the slot antenna per unit area to allow reduced plasma generation in the container in the vicinity of the periphery and hence a more uniform plasma distribution as seen in a plane.

Although the present invention has been described and illustrated in detail, it is clearly understood that the same is by way of illustration and example only and is not to be taken by way of limitation, the spirit and scope of the present invention being limited only by the terms of the appended claims.

INDUSTRIAL APPLICABILITY

The present invention can be used for plasma apparatuses, plasma processes and the like typically employed for example to fabricate semiconductor devices.

What is claimed is:

1. A plasma apparatus using a slot antenna having a radiation plane provided with a plurality of slots to supply a container with an electromagnetic field to generate plasma, said slot being so formed that, when said radiation plane is seen as being so divided into a center, a periphery, and an intermediate region located between said center and said periphery, the electromagnetic field provides radiation that is substantially uniform from said center to said intermediate region and that monotonically decreases from said intermediate region to said periphery.

2. The plasma apparatus of claim 1, wherein each said slot is monotonically increased in length, as seen from said center toward said intermediate region, and monotonically decreased in length, as seen from said intermediate region toward said periphery.

3. The plasma apparatus of claim 1, wherein said radiation plane per unit area has said slots monotonously increasing in number, as seen from said center toward said intermediate region, and monotonically decreasing in number, as seen from said intermediate region toward said periphery.

4. A method using a slot antenna to supply a container with an electromagnetic field to generate plasma, comprising supplying the electromagnetic field such that, when a radiation plane is seen as being divided into a center, a periphery, and an intermediate region located between said center and said periphery, the electromagnetic field provides radiation that is substantially uniform from said center to said intermediate region and that monotonically decreases from said intermediate region to said periphery to generate said plasma.

5. The method of claim 4, wherein the radiation per unit area is monotonously decreased from said intermediate region toward said periphery.

6. The method of claim 4, wherein said slot antenna is provided with slots each of which monotonically increases in length as seen from said center toward said intermediate region and monotonically decreases in length as seen from said intermediate region toward said periphery.

7. The method of claim 4 slots of said slot antenna monotonically increase in number, as seen from said center toward said intermediate region, and monotonically decrease in number, as seen from said intermediate region toward said periphery.

8. A plasma apparatus using a slot antenna having a radiation plane provided with a plurality of slots to supply a container with an electromagnetic field to generate plasma, said slot being so formed that at a periphery of said radiation plane the electromagnetic field provides radiation smaller per unit area in amount than at an intermediate region of said radiation plane located between a center of said radiation plane and said periphery of said radiation plane, wherein each said slot is monotonically increased in length, as seen from said center toward said intermediate region of said radiation plane, and monotonically decreased in length, as seen from said intermediate region toward said periphery of said radiation plane.

9. A plasma apparatus using a slot antenna having a radiation plane provided with a plurality of slots to supply a container with an electromagnetic field to generate plasma, said slot being so formed that at a periphery of said radiation plane the electromagnetic field provides radiation smaller per unit area in amount than at an intermediate region of said radiation plane located between a center of said radiation plane and said periphery of said radiation plane, wherein said radiation plane per unit area has said slots monotonically increasing in number, as seen from said center toward said intermediate region of said radiation plane, and monotonically decreasing in number, as seen from said intermediate region toward said periphery of said radiation plane.

* * * * *